(12) United States Patent
Li et al.

(10) Patent No.: US 12,119,138 B2
(45) Date of Patent: Oct. 15, 2024

(54) METHOD FOR MANUFACTURING TRANSPARENT ELECTRODE WITH LOW SURFACE ROUGHNESS

(71) Applicant: Nanjing University of Posts and Telecommunications, Jiangsu (CN)

(72) Inventors: Dongdong Li, Jiangsu (CN); Wenyong Lai, Jiangsu (CN)

(73) Assignee: Nanjing University of Posts and Telecommunications, Jiangsu (CN)

( * ) Notice: Subject to any disclaimer, the term of this patent is extended or adjusted under 35 U.S.C. 154(b) by 0 days.

(21) Appl. No.: 18/025,629

(22) PCT Filed: Jul. 15, 2022

(86) PCT No.: PCT/CN2022/105865
§ 371 (c)(1),
(2) Date: Mar. 9, 2023

(87) PCT Pub. No.: WO2023/082686
PCT Pub. Date: May 19, 2023

(65) Prior Publication Data
US 2024/0186034 A1 Jun. 6, 2024

(30) Foreign Application Priority Data
Nov. 9, 2021 (CN) .......................... 202111317938.2

(51) Int. Cl.
*H01M 4/139* (2010.01)
*H01B 5/14* (2006.01)
(Continued)

(52) U.S. Cl.
CPC .......... *H01B 13/0026* (2013.01); *H01B 5/14* (2013.01); *H01B 13/0016* (2013.01); *B82Y 30/00* (2013.01)

(58) Field of Classification Search
CPC .................................................... H01M 4/139
See application file for complete search history.

(56) References Cited

U.S. PATENT DOCUMENTS

2005/0042556 A1* 2/2005 Louwet ............... H01B 1/22
430/502
2011/0018424 A1* 1/2011 Takada ............... H10K 50/81
313/352

FOREIGN PATENT DOCUMENTS

CN 107068291 8/2017
CN 107068291 A * 8/2017 ......... H01B 13/0026
(Continued)

OTHER PUBLICATIONS

Gaynor et al. Smooth Nanowire/Polymer Composite Transparent Electrodes. Advanced Materials. 23. 2011. (Year: 2011).*
(Continued)

*Primary Examiner* — Cachet I Proctor
(74) *Attorney, Agent, or Firm* — JCIPRNET

(57) ABSTRACT

A method for manufacturing a transparent electrode with a low surface roughness, in particular a method for preparing a large-area, low-cost and patterned transparent electrode using the screen-printing technology, which focuses on solving the problem of a high roughness of a screen-printed pattern. First, a substrate is coated with a layer of a smooth conductive material, then screen printing is performed to obtain a conductive pattern, and finally, a layer of a surfactant-modified composite conductive material is applied and film transfer printing is performed to obtain a transparent electrode with a low surface roughness. The transparent electrode prepared by the method retains a smooth surface of the original substrate after peeling, which has a remarkably low surface roughness and a significantly increased success rate of film transfer printing, and can be directly applied to
(Continued)

various photoelectric devices, such as solar batteries, LEDs, flat panel displays and electronic sensors.

8 Claims, 2 Drawing Sheets

(51) Int. Cl.
   *H01B 13/00* (2006.01)
   *B82Y 30/00* (2011.01)

(56) References Cited

FOREIGN PATENT DOCUMENTS

| | | |
|---|---|---|
| CN | 107610802 | 1/2018 |
| CN | 113782256 | 12/2021 |

OTHER PUBLICATIONS

Li et al., A Simple Strategy towards Highly Conductive Silver-Nanowire Inks for Screen-Printed Flexible Transparent Conductive Films and Wearable Energy-Storage Devices. Adv. Mater. Technol. 2019, 4. (Year: 2019).*

Nguyen et al. Facile Fabrication of Highly Conductive, Ultrasmooth, and Flexible Silver Nanowire Electrode for Organic Optoelectronic Devices. ACS Applied Materials & Interfaces 2019. 45 (Year: 2019).*

"International Search Report (Form PCT/ISA/210) of PCT/CN2022/105865," mailed on Aug. 29, 2022, pp. 1-4.

"Written Opinion of the International Searching Authority (Form PCT/ISA/237) of PCT/CN2022/105865," mailed on Aug. 29, 2022, pp. 1-4.

* cited by examiner

METHOD FOR MANUFACTURING TRANSPARENT ELECTRODE WITH LOW SURFACE ROUGHNESS

CROSS-REFERENCE TO RELATED APPLICATION

This application is a 371 of international application of PCT application serial no. PCT/CN2022/105865, filed on Jul. 15, 2022, which claims the priority benefit of China application no. 202111317938.2, filed on Nov. 9, 2021. The entirety of each of the above mentioned patent applications is hereby incorporated by reference herein and made a part of this specification.

TECHNICAL FIELD

The present invention relates to a method for manufacturing a transparent electrode with a low surface roughness, belonging to the field of new-generation information technology industry.

RELATED ART

With the rapid development of solar cells, LEDs, flat panel displays and electronic sensors, the transparent electrodes for use are required to have the performance of low cost, high electrical conductivity, high transparency, and low surface roughness, etc. Screen printing technology shows huge advantages in the preparation of low-cost, large-area and patterned films. To prepare a transparent electrode with a patterned metal nanostructure, the existing method is to screen print patterned metal nanostructure on a transparent substrate. How to reduce the roughness of the screen-printed pattern is still a challenging problem. The surface roughness of the electrode will greatly affect the preparation of subsequent functional layers and the performance of the final device. For example, a hole transport layer, a light emitting layer, an electron transport layer is needed to be coated on the electrode of an LED, and if the electrode has a high surface roughness, the preparation quality of the upper functional layers will be affected, which will ultimately reduce the light emitting efficiency and even cause short circuiting of the device. Therefore, overcoming this difficulty is of great significance for the preparation of high-performance transparent electrodes.

SUMMARY OF INVENTION

An objective of the present invention is to provide a method for manufacturing a transparent electrode with a low surface roughness, aiming to solve the shortcomings of the transparent electrodes in the prior art in terms of manufacturing cost, surface roughness and success rate of transfer printing. The transparent electrode manufactured in the present invention has obvious advantages in the performance such as transparency, electrical conductivity, and large area, and can meet the performance requirements of transparent electrodes for various photoelectric devices such as solar cells, LEDs, flat panel displays and electronic sensors.

In order to achieve the above-mentioned objective, the present invention provides a method for manufacturing a transparent electrode with a low surface roughness. First, a substrate is coated with a layer of a smooth conductive material, then screen printing is performed to obtain a conductive pattern, and finally, a layer of a surfactant-modified composite conductive material is applied and film transfer printing is performed by using of a liquid substrate to obtain a transparent electrode with a low surface roughness. As shown in FIG. 1, the transparent electrode is prepared according to the following specific steps:

step S1: coating a smooth-surface A substrate 1 with a layer of a smooth conductive material 2 through a blade coating or spin coating technique, and then performing a drying treatment;

step S2: performing further printing, which is screen printing, on the upper surface of the conductive material 2 using a screen-printing ink, to form a screen-printed pattern 3, and then performing a drying treatment;

step S3: applying a layer of a composite conductive material 4 by blade coating to the upper surface of the screen-printed pattern 3 treated in step S2, and then performing a drying treatment;

step S4: applying a liquid B substrate 5 material to the upper surface of the composite conductive material 4 treated in step S3 such that the overall lower conductive materials including the conductive material 2, the screen-printed pattern 3 and the composite conductive material 4 are all embedded in the B substrate 5 material, and then performing vacuum de-foaming and heat curing processes such that the B substrate 5 material forms a solid film, wherein the purpose of using the liquid substrate material here is to embed the overall lower conductive materials into the B substrate material, so as to facilitate follow-up peeling of the transparent electrode; and step S5: peeling off the B substrate 5, together with the conductive material 2 in step S1, the screen-printed pattern 3 in step S2 and the composite conductive material 4 in step S3, from the A substrate to obtain the transparent electrode.

The A substrate is preferably any one of glass, polyethylene terephthalate (PET), polyimide (PI), or a silicon wafer.

The B substrate is preferably any one of polydimethylsiloxane (PDMS) or a hydrogenated styrene-butadiene block copolymer (SEBS).

In step S1, the conductive material coated on the A substrate is preferably any one of a silver nanowire, a copper nanowire, poly(3,4-ethylene dioxythiophene)/polystyrene sulfonate (PEDOT:PSS), and graphene.

The screen-printing ink is preferably any one of a silver nanowire ink, a copper nanowire ink, a silver nanoparticle ink, a copper nanoparticle ink, poly(3,4-ethylene dioxythiophene)/polystyrene sulfonate (PEDOT:PSS), and graphene ink.

The composite conductive material is preferably any one of a silver nanowire with poly (3,4-ethylene dioxythiophene)/polystyrene sulfonate (PEDOT: PSS), a silver nanowire with graphene, a copper nanowire with poly (3,4-ethylene dioxythiophene)/polystyrene sulfonate (PEDOT: PSS), and a copper nanowire with graphene.

In order to further improve the success rate of transfer printing, the composite conductive material is a composite conductive material modified with a nonionic surfactant, and the nonionic surfactant is preferably any one of long-chain fatty alcohol polyoxyethylene ether, alkyl phenyl polyoxyethylene ether, polyoxyethylene fatty acid, polyoxyethylene alkylamine, polyoxyethylene alkyl amide and polyethers.

In the present invention, before screen printing, a substrate is coated with a layer of a smooth conductive material, then the screen-printed pattern is transferred to another substrate by applying a modified composite conductive material and using a transfer printing technique. The bonding force between the conductive material and the B substrate is much greater than the bonding force between the conductive material and the A substrate, and thus a high success rate of transfer printing is guaranteed. The as-prepared transparent electrode by using this method retains the original smooth surface of the A substrate contact surface after the original A substrate is peeled off, and thus has a remarkably low surface roughness, thereby improving the performance of the transparent electrode.

In addition, the smooth surface of the transparent electrode prepared in the present invention can be coated with other functional layers to construct photoelectric devices such as solar cells, LEDs, flat panel displays and electronic sensors, which will improve the overall preparation quality of the photoelectric devices and thus improve the performance of the photoelectric devices.

In conclusion, the transparent electrode prepared in the present invention has a remarkably low surface roughness, a low cost and excellent photoelectric performance, meets the requirements for high-performance transparent electrodes of various photoelectric devices such as solar cells, LEDs, flat panel displays and electronic sensors, and has an important advantage in industrialization.

Herein: 1—A substrate; 2—Conductive material; 3—Screen—printed pattern; 4—Composite conductive material; and 5—B substrate.

DESCRIPTION OF EMBODIMENTS

The present invention is further described in conjunction with accompanying drawings and specific examples, but is not limited to the examples below. The following methods, unless otherwise specified, are all conventional methods.

Example 1

1) A PET substrate was coated with a layer of a smooth silver nanowire film, 0.3 µm in thickness, through a blade coating technique, and a drying treatment was performed at 120° C.; 2) a silver nanowire mesh, 3.5 mm in side length and 1 µm in thickness, was made by printing on the upper surface of the silver nanowire film through a screen printing technique, and a drying treatment was performed at 120° C.; 3) a layer of a composite conductive material, 0.2 µm in thickness, of a silver nanowire+poly(3,4-ethylene dioxythiophene)/polystyrene sulfonate PEDOT:PSS+a nonionic surfactant long-chain fatty alcohol polyoxyethylene ether was applied by blade coating to the upper surface of the silver nanowire mesh, where a mass ratio of the silver nanowire to the PEDOT:PSS was 0.4:1; and a drying treatment was performed at 120° C.; 4) liquid PDMS was uniformly applied to the upper surface of the composite conductive material, and vacuum de-foaming and heat curing processes were performed such that the PDMS formed a solid film; and 5) the PDMS substrate was peeled off from the PET substrate to obtain a transparent conductive electrode.

Figure 1:
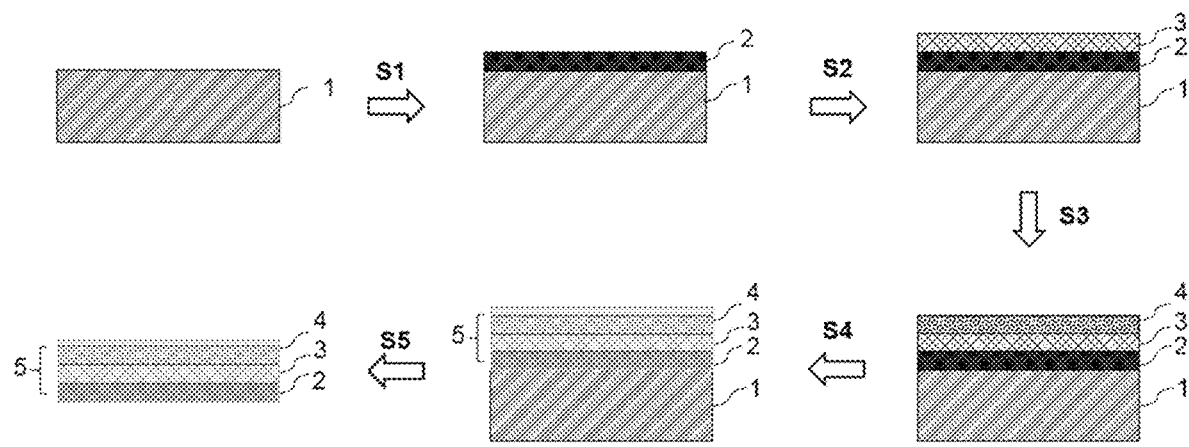
FIG. 1 is a schematic diagram illustrating a preparation flow of the transparent electrode according to the present invention.
Figure 2:
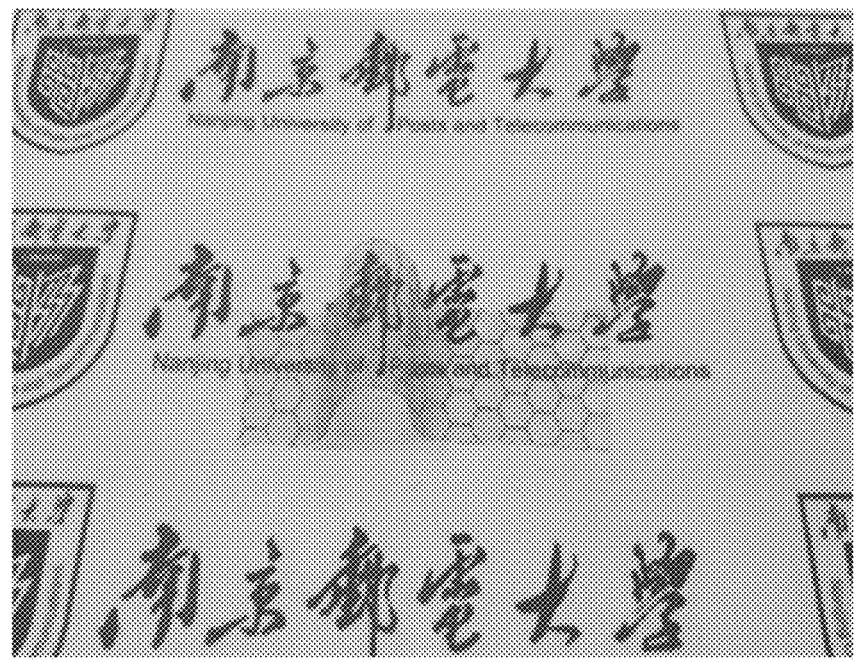
FIG. 2 illustrates a photo of a transparent electrode obtained by the preparation method according to Example 1.
Figure 3:
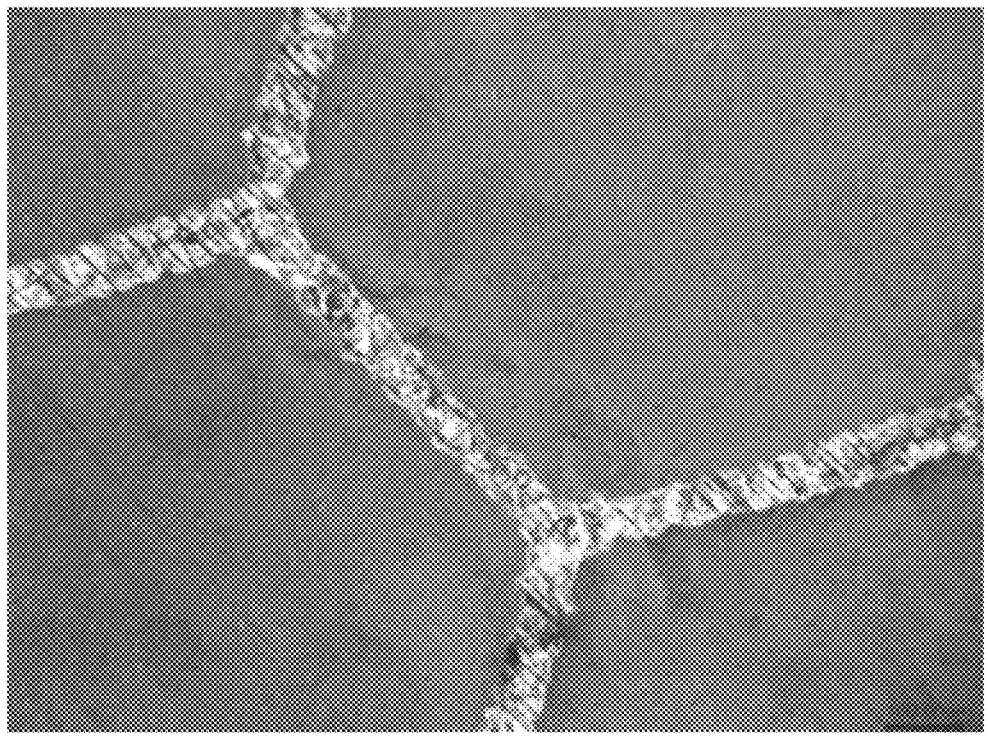
FIG. 3 illustrates a photo under an optical microscope of a transparent electrode obtained by the preparation method according to Example 1.

The silver nanowire transparent electrode prepared by this method has a very low surface roughness of 2.7 nm, a film sheet resistance as low as 18 $\Omega sq^{-1}$, and a transparency up to 91%. The photo of the screen-printed transparent electrode after transfer printing is shown in FIG. 2, and the photo under an optical microscope of the screen-printed transparent electrode after transfer printing is shown in FIG. 3.

Example 2

1) A PET substrate was coated with a layer of a smooth silver nanowire film, 0.3 µm in thickness, through a blade coating technique, and a drying treatment was performed at 120° C.; 2) a silver nanowire mesh, 3 mm in side length and 1 µm in thickness, was made by printing on the upper surface of the silver nanowire film through a screen printing technique, and a drying treatment was performed at 120° C.; 3) a layer of a composite conductive material, 0.2 µm in thickness, of a silver nanowire+poly(3,4-ethylene dioxythiophene)/polystyrene sulfonate PEDOT:PSS+a nonionic surfactant long-chain fatty alcohol polyoxyethylene ether was applied by blade coating to the upper surface of the silver nanowire mesh, where a mass ratio of the silver nanowire to the PEDOT:PSS was 0.4:1; and a drying treatment was performed at 120° C.; 4) liquid PDMS was uniformly applied to the upper surface of the composite conductive material, and vacuum de-foaming and heat curing processes were performed such that the PDMS formed a solid film; and 5) the PDMS substrate was peeled off from the PET substrate, to obtain a transparent conductive electrode.

The silver nanowire transparent electrode prepared by this method has a very low surface roughness of 2.7 nm, a film sheet resistance as low as 12 $\Omega sq^{-1}$, and a transparency up to 88%; and the performance of the screen-printed transparent electrode in all aspects is at a leading level.

Example 3

1) A PET substrate was coated with a layer of a smooth silver nanowire film, 0.3 µm in thickness, through a blade coating technique, and a drying treatment was performed at 120° C.; 2) a silver nanowire mesh, 2 mm in side length and 1 µm in thickness, was made by printing on the upper surface of the silver nanowire film through a screen printing technique, and a drying treatment was performed at 120° C.; 3) a layer of a composite conductive material, 0.2 µm in thickness, of a silver nanowire+poly(3,4-ethylene dioxythiophene)/polystyrene sulfonate PEDOT:PSS+a nonionic surfactant long-chain fatty alcohol polyoxyethylene ether was applied by blade coating to the upper surface of the silver nanowire mesh, where a mass ratio of the silver nanowire to the PEDOT:PSS was 0.4:1; and a drying treatment was performed at 120° C.; 4) liquid PDMS was uniformly applied to the upper surface of the composite conductive material, and vacuum de-foaming and heat curing processes were performed such that the PDMS formed a solid film; and 5) the PDMS substrate was peeled off from the PET substrate, to obtain a transparent conductive electrode. The silver nanowire transparent electrode prepared by this method has a very low surface roughness of 2.7 nm, a film sheet resistance as low as 10 $\Omega sq^{-1}$, and a transparency up to 84%; and the performance of the screen-printed transparent electrode in all aspects is at a leading level.

Example 4

1) A PET substrate was coated with a layer of a smooth silver nanowire film, 0.3 µm in thickness, through a blade coating technique, and a drying treatment was performed at 120° C.; 2) a silver nanowire mesh, 1.5 mm in side length and 1 μm in thickness, was made by printing on the upper surface of the silver nanowire film through a screen printing technique, and a drying treatment was performed at 120° C.; 3) a layer of a composite conductive material, 0.2 μm in thickness, of a silver nanowire+poly(3,4-ethylene dioxythiophene)/polystyrene sulfonate PEDOT:PSS+a nonionic surfactant long-chain fatty alcohol polyoxyethylene ether was applied by blade coating to the upper surface of the silver nanowire mesh, where a mass ratio of the silver nanowire to the PEDOT:PSS was 0.4:1; and a drying treatment was performed at 120° C.; 4) liquid PDMS was uniformly applied to the upper surface of the composite conductive material, and vacuum de-foaming and heat curing processes were performed such that the PDMS formed a solid film; and 5) the PDMS substrate was peeled off from the PET substrate to obtain a transparent conductive electrode. The silver nanowire transparent electrode prepared by this method has a very low surface roughness of 2.7 nm, a film sheet resistance as low as 8 $\Omega sq^{-1}$, and a transparency up to 77%; and the performance of the screen-printed transparent electrode in all aspects is at a leading level.

What is claimed is:

1. A method for manufacturing a transparent electrode, comprising the following specific steps:
   step S1: coating a smooth-surface A substrate with a layer of a smooth conductive material, and then performing a drying treatment;
   step S2: performing further printing, which is screen printing, on an upper surface of the conductive material of step S1 using a screen-printing ink, to form a screen-printed pattern, and then performing a drying treatment;
   step S3: applying a layer of a composite conductive material by blade coating to an upper surface of the screen-printed pattern treated in step S2, and then performing a drying treatment;
   step S4: applying a liquid B substrate material to an upper surface of the composite conductive material treated in step S3 such that the conductive material in step S1, the screen-printed pattern in step S2, and the composite conductive material in step S3 are all embedded in the B substrate material, and then performing vacuum de-foaming and heat curing processes such that the B substrate material forms a solid film; and
   step S5: peeling off the B substrate, together with the conductive material in step S1, the screen-printed pattern in step S2 and the composite conductive material in step S3, from the A substrate to obtain the transparent electrode.

2. The method for manufacturing a transparent electrode according to claim 1, wherein the A substrate is any one of glass, polyethylene terephthalate (PET), polyimide (PI), or a silicon wafer.

3. The method for manufacturing a transparent electrode according to claim 1, wherein the B substrate is any one of polydimethylsiloxane (PDMS) or a hydrogenated styrene-butadiene block copolymer (SEBS).

4. The method for manufacturing a transparent electrode according to claim 1, wherein the conductive material coated on the A substrate is any one of a silver nanowire, a copper nanowire, poly (3,4-ethylene dioxythiophene)/polystyrene sulfonate (PEDOT: PSS), or graphene.

5. The method for manufacturing a transparent electrode according to claim 1, wherein the screen-printing ink is any one of a silver nanowire ink, a copper nanowire ink, a silver nanoparticle ink, a copper nanoparticle ink, poly (3,4-ethylene dioxythiophene)/polystyrene sulfonate (PEDOT: PSS), or graphene ink.

6. The method for manufacturing a transparent electrode according to claim 1, wherein the composite conductive material is any one of a silver nanowire with poly (3,4-ethylene dioxythiophene)/polystyrene sulfonate (PEDOT: PSS), a silver nanowire with graphene, a copper nanowire with poly (3,4-ethylene dioxythiophene)/polystyrene sulfonate (PEDOT: PSS), or a copper nanowire with graphene.

7. The method for manufacturing a transparent electrode according to claim 1, wherein the composite conductive material is a composite conductive material modified by a nonionic surfactant.

8. The method for manufacturing a transparent electrode according to claim 7, wherein the nonionic surfactant for modification is any one of long-chain fatty alcohol polyoxyethylene ether, alkyl phenyl polyoxyethylene ether, polyoxyethylene fatty acid, polyoxyethylene alkylamine, polyoxyethylene alkyl amide, or polyethers.

* * * * *